United States Patent
Natarajan et al.

(10) Patent No.: US 9,577,600 B2
(45) Date of Patent: Feb. 21, 2017

(54) VARIABLE LOAD FOR REFLECTION-TYPE PHASE SHIFTERS

(71) Applicant: INTERNATIONAL BUSINESS MACHINES CORPORATION, Armonk, NY (US)

(72) Inventors: Arun S. Natarajan, White Plains, NY (US); Scott K. Reynolds, Amawalk, NY (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 921 days.

(21) Appl. No.: 13/739,599

(22) Filed: Jan. 11, 2013

(65) Prior Publication Data
US 2015/0270821 A1     Sep. 24, 2015

(51) Int. Cl.
*H04B 1/44*     (2006.01)
*H03H 7/20*     (2006.01)
*H03H 7/48*     (2006.01)

(52) U.S. Cl.
CPC ........... *H03H 7/20* (2013.01); *H03H 7/48* (2013.01)

(58) Field of Classification Search
CPC ........ H01Q 3/267; H01Q 3/2694; H01Q 3/46; H01Q 21/0018; H01Q 1/1292; H01Q 1/286; H01Q 5/42; H01Q 21/065; H01Q 13/08; H01P 5/16
USPC ........................................................ 455/78
IPC ........................................................ H01P 5/16
See application file for complete search history.

(56) References Cited

U.S. PATENT DOCUMENTS

| | | | | |
|---|---|---|---|---|
| 3,768,045 A | * | 10/1973 | Chung | ............ H03H 7/20 333/1.1 |
| 5,712,641 A | * | 1/1998 | Casabona | ............ G01S 19/21 342/362 |
| 6,020,795 A | * | 2/2000 | Kim | ............ H01P 5/04 333/109 |
| 6,111,477 A | | 8/2000 | Klymyshyn et al. | |
| 6,194,980 B1 | * | 2/2001 | Thon | ............ H01P 5/227 333/109 |

(Continued)

FOREIGN PATENT DOCUMENTS

| | | |
|---|---|---|
| JP | 2007166239 | 6/2007 |
| JP | 2007258763 | 10/2007 |
| JP | 2009278618 | 11/2009 |

OTHER PUBLICATIONS

Judy, D.C., et al. "Reflection-Type Continuously-Tunable Phase Shifter Using PZT Thin-Film Capacitors" Electronics Letters, vol. 45, No. 3. Jan. 2009. (2 Pages).

(Continued)

*Primary Examiner* — Ajibola Akinyemi
(74) *Attorney, Agent, or Firm* — Tutunjian & Bitetto, P.C.; Daniel P. Morris

(57) ABSTRACT

Methods and systems for phase shifting include a hybrid quadrature coupler having an input, an output, and two termination loads. Each termination load includes multiple terminations, each termination having a varactor; and one or more transmission lines separating the terminations. A control module is configured to determine a phase shift and gain to apply to the input and to independently control a capacitance of each varactor such that the output of the hybrid quadrature coupler is shifted by the determined phase shift relative to the input with the determined gain.

21 Claims, 5 Drawing Sheets

(56) References Cited

U.S. PATENT DOCUMENTS

| | | | |
|---|---|---|---|
| 6,335,665 B1* | 1/2002 | Mendelsohn | H01P 9/00 |
| | | | 333/109 |
| 6,853,691 B1* | 2/2005 | Kim | H04L 27/368 |
| | | | 375/308 |
| 7,154,357 B2 | 12/2006 | Kozyrev et al. | |
| 2009/0009265 A1 | 1/2009 | Chiang | |
| 2009/0278624 A1 | 11/2009 | Tsai et al. | |
| 2010/0171567 A1 | 7/2010 | Krishnaswamy et al. | |
| 2012/0105172 A1 | 5/2012 | Tsai et al. | |

OTHER PUBLICATIONS

Krishnaswamy, H., et al. "A Silicon-Based, All-Passive, 60 Ghz, 4-Element, Phased-Array Beamformer Featuring a Differential, Reflection-Type Phase Shifter" 2010 IEEE International Symposium on Phased Array Systems and Technology (Array). Oct. 2010. pp. 225-232.

* cited by examiner

US 9,577,600 B2

VARIABLE LOAD FOR REFLECTION-TYPE PHASE SHIFTERS

GOVERNMENT RIGHTS

This invention was made with Government support under Contract No.: HR0011-11-C-0136 awarded by the Defense Advanced Research Projects Agency (DARPA). The Government has certain rights in this invention.

BACKGROUND

Technical Field

The present invention relates to phase shifters and, more particularly, to providing variable loads for reflection-type phase shifters.

Description of the Related Art

Directional transmitters and receivers allow signals to be transmitted and received to/from specific directions while attenuating signals to/from other directions. Electronic steering of the preferred direction of the signal beam can be accomplished by using multiple transmitters and receivers with variable phase shift capability. Electronic variation of the phase shift results in steering the beam direction.

Typical beam steering applications need precise control of the beam pattern, both in the peak angle as well as in filtering. This uses amplitude control as well as variable phase shift in each transmitter/receiver element. To simplify pattern generation, amplitude control is separated from phase control. Such separation needs a relatively constant loss or gain in the variable phase shifter across phase shift values. Conventional phase shifters often use varactors to provide a variation in phase shift values, but varactors often vary in quality and factor and loss with the value of the capacitance. As such, implementing a termination for a reflection-type phase shifter using varactors leads to losses that vary with the phase shift. While an amplifier may be used to compensate for these losses, using active components defeats part of the purpose of using a reflection-type phase shifter.

SUMMARY

A phase shifter is shown that includes a hybrid quadrature coupler having an input, an output, and two termination loads; and a control module. Each termination load includes multiple terminations, each termination having a varactor; and one or more transmission lines separating the terminations. The control module is configured to determine a phase shift and gain to apply to the input and to independently control a capacitance of each varactor such that the output of the hybrid quadrature coupler is shifted by the determined phase shift relative to the input with the determined gain.

A phase-shifter is shown that includes a hybrid quadrature coupler having an input, an output, and two termination loads; and a control module. Each termination load includes a plurality of terminations comprising a capacitor and a switch; and one or more transmission lines separating the terminations. The control module is configured to determine a phase shift and gain to apply to the input and to independently control each switch such that the output of the hybrid quadrature coupler is shifted by the determined phase shift relative to the input with the determined gain.

A communication device is shown that includes a plurality of antennas, each antenna having an associated phase shifter comprising a hybrid quadrature coupler having an input, an output, and two termination loads; and a control module. Each termination load includes a plurality of terminations comprising a varactor and a switch; and one or more transmission lines separating the terminations. The control module is configured to determine a phase shift and gain to apply to the input and to independently control each switch and a capacitance of each varactor such that the output of the hybrid quadrature coupler is shifted by the determined phase shift relative to the input with the determined gain to produce a beam steering effect.

A method for phase shifting a signal is shown that includes determining a phase shift and gain to apply to an input signal; and adjusting a capacitance for a plurality of varactors in each termination load in a hybrid quadrature coupler to produce a phase shifted output signal having the determined gain.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide a reflection-type phase shifter that includes a variable load, where the phase shift between the input and output depends on the value of the load. Instead of using a single varactor to provide the variable load, the present principles provide for the use of a passive network using transmission lines and multiple varactors. The use of a reflection-type phase shifter is advantageous to other forms of phase shifter due to its being a passive component. As a result, its operation is linear and does not consume power. Furthermore, the reflection-type phase shifter is wideband in operation, is bi-directional, and works well at high frequencies.

Figure 1:
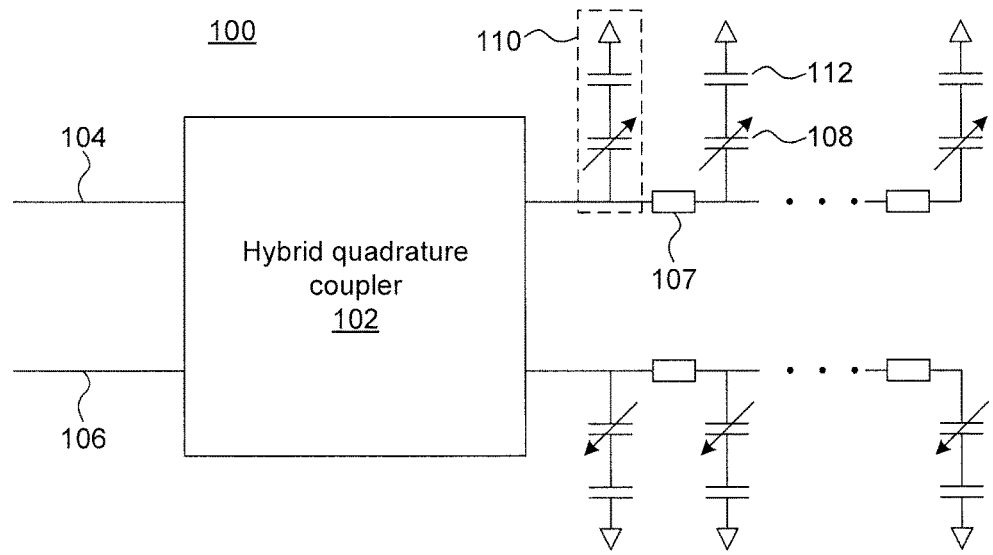
FIG. 1 is a diagram of a phase shifter having multiple-varactor termination loads in accordance with one illustrative embodiment.

Referring now to the drawings in which like numerals represent the same or similar elements and initially to FIG. 1, a reflection-type phase shifter 100 is shown that employs terminations 110 separated by transmission lines 107. An input signal 104 enters a hybrid quadrature coupler 102, which provides a phase shifted output 106. The hybrid quadrature coupler 102 has two further termination loads, each formed from terminations 110. Each termination 110 is formed from a varactor 108 and a bypass capacitor 112 and is connected to ground. This design allows the capacitance of the different varactors 108 to be adjusted independently, such that specific combinations of capacitance values can be selected to achieve a desired gain across different phase shifts. This allows the phase shifter 100 to compensate for loss variations, not only in the termination loads, but elsewhere in the signal chain as well. The bypass capacitors 112 allow the varactors 108 to be connected to a DC voltage. At radio frequencies the bypass capacitors 112 provide a low impedance to ground. Without the bypass capacitors 112, one varactor's terminal would be at ground, reducing the variable capacitance range of the varactors 108.

It should be recognized that the phase shifter 100 is a passive device. As such, the "gain" described herein represents power losses within the phase shifter. By controlling the losses present within the phase shifter, varying losses elsewhere can be accounted for and smoothed out. Thus phase shifter 100 is useful not only to provide the phase shift for beam steering applications, but also serves to regulate signal power.

It is specifically contemplated that the termination loads may have two terminations 110 each. If ideal components were available, any number of terminations 110 could be used. However, the practical number is limited by available circuit area, performance degradation that comes with additional terminations 110, and increased complexity in the control circuitry. At low frequencies of operation and with advanced fabrication technologies it may be feasible to have additional terminations 110, and it is contemplated that those having ordinary skill in the art will be able to select an appropriate number of terminations 110 according to their design needs.

It should be noted that the phase shifters described herein may be implemented as part of a silicon fabrication process. In particular, the varactors 108 may be implemented as accumulation-mode or depletion-mode devices, according to the fabrication processes available. In one embodiment, the transmission lines 107 may be implemented using a silicon process technology that has different layers of metallization for signals and for ground. If quality components are used, such that the varactors 108 have predictable loss properties, then no calibration should be necessary.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
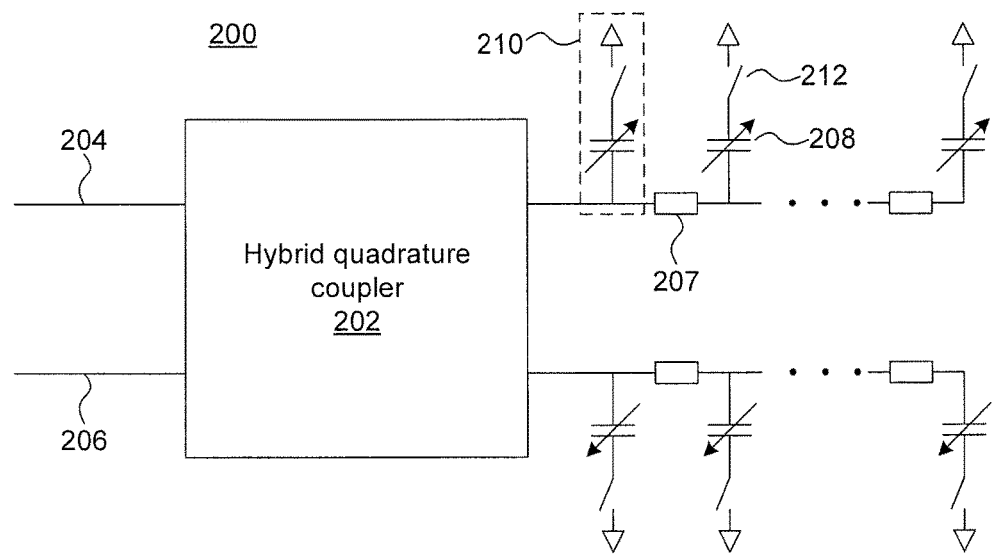
FIG. 2 is a diagram of a phase shifter having switched capacitors in accordance with one illustrative embodiment.

Referring now to FIG. 2, a reflection-type phase shifter 200 is shown that employs on-off switches to vary capacitance. A hybrid quadrature coupler 202 receives an input signal 204 and produces a phase-shifted output signal 206. The coupler 202 has two termination loads formed from terminations 210 and transmission lines 207. Each termination 210 is formed from a varactor 208 and a switch 212. The phase shifter 200 may be adjusted by turning switches 212 on and off.

It should be recognized that the present principles may also be used in an embodiment that has static capacitors instead of varactors 208, using only the switches 212 to control the capacitance. As such, switched capacitors, varactors, or a combination of both (as shown in FIG. 2) may be used. A switched embodiment is less sensitive to process and voltage variations and allows for digital control, while a varactor embodiment may work better at frequencies where switch performance is poor.

Figure 3:
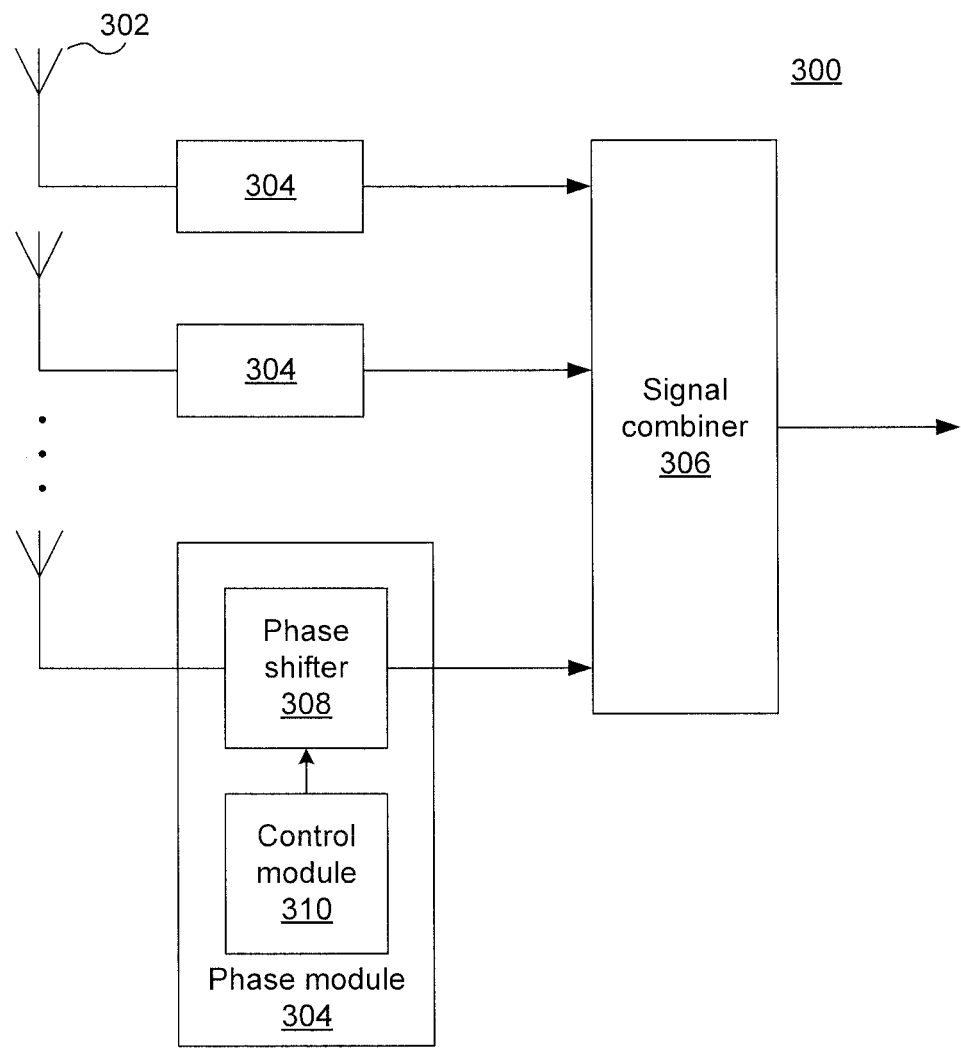
FIG. 3 is a diagram of a beam steering transceiver using phase shifters in accordance with one illustrative embodiment.

Referring now to FIG. 3, a front-end portion 300 of a directed-beam transceiver is shown. A set of antennas 302 receives an incoming signal. If the incoming signal arrives at the antennas 302 at any direction other than perpendicular to the line of the antennas 302, the signal will arrive at each antenna 302 with a successively greater time delay. Similarly, a transmitted signal that is sent with a time delay between the antennas 302 will focus the beam in a specific direction. This time delay translates to a phase delay in the received signals. To compensate for (or to produce) the phase delay, phase modules 304 introduce a phase shift in the signals. A phase shifter 308 performs the phase shift as described above, with the multiple terminations in each load providing a desired amplitude.

The phase shifter is controlled by a control module 310 which controls the capacitance of the varactors and/or selectively engages the switches to produce the desired capacitance. Each beam position will have an associated phase delay for each antenna 302. The control modules 310 provide associated control parameters to the phase shifters

308 based on stored information. Toward this end, the control modules 310 may be implemented separately, with distinct logic at each phase module 304, or may be implemented centrally, with a single, central control module providing information to the different phase modules 304. The phase shift produced by the phase shifters 308 may be determined according to the termination impedance of the phase shifter as:

$$\Phi = 2\tan^{-1}\left(\frac{X}{Z_0}\right),$$

where X is the impedance of the termination and $Z_0$ is the characteristic impedance of the phase shifter's coupler.

Figure 4:
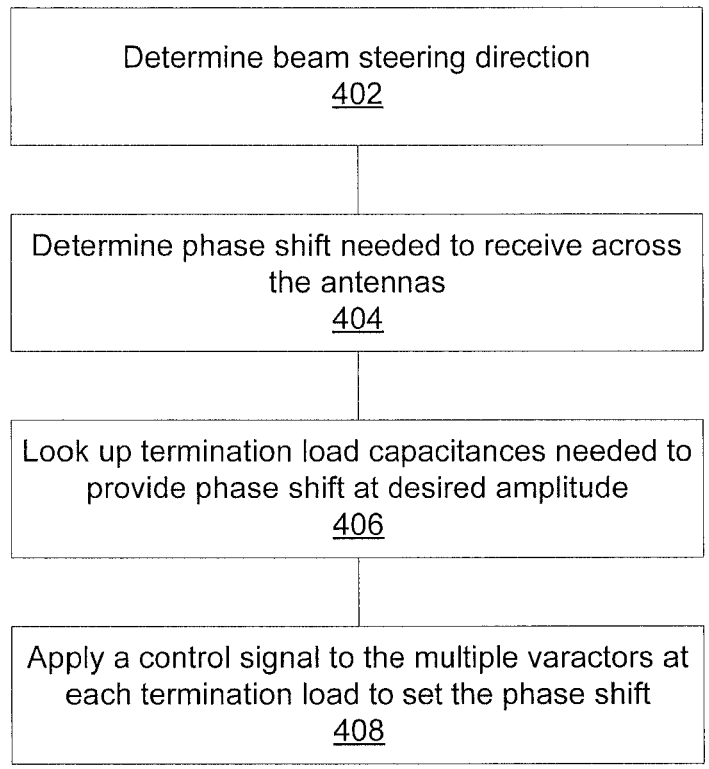
FIG. 4 is a block/flow diagram of a method for phase shifting a signal in accordance with one illustrative embodiment.

Referring now to FIG. 4, a method of producing a phase shift using a reflection-type phase-shifter in the context of beam-steering is shown. This method is equally applicable to transmitting and receiving applications. Block 402 determines the desired direction for beam steering using a set of antennas (e.g., 302). This beam steering may represent a direction of high-gain transmission or high-gain reception. Based on the beam steering direction, block 404 determines a phase shift to be applied to each of the antennas 302. The phase shifts may be stored in a lookup table, either locally or in a central location.

Based on the phase shift for each antenna 302, block 406 looks up the termination load capacitances that are needed to provide that phase shift at the desired amplitude. Each phase shift for each antenna will have multiple associated capacitance control values, and block 408 uses a control module 310 to apply those capacitance control values to a phase shifter 308 associated with each antenna 302. This sets the phase shift for the antennas 302, allowing transmission or reception according to the desired beam steering.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
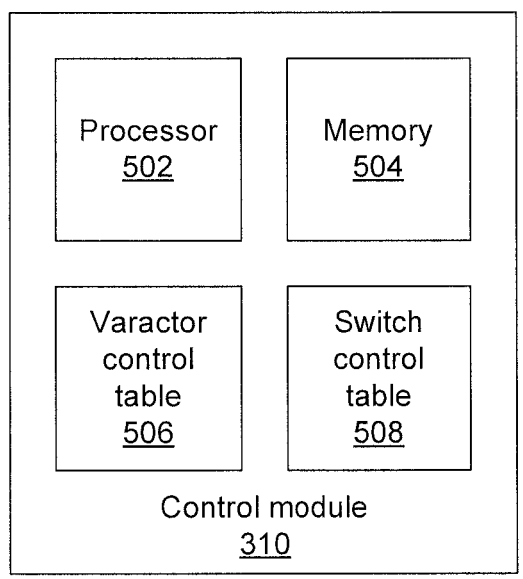
FIG. 5 is a diagram of a control module to control a phase shifter in accordance with one illustrative embodiment.

Referring now to FIG. 5, a diagram of the control module 310 is shown. As described above, the control module 310 may be a centralized unit, or may be represented as multiple individual units associated with respective phase modules 304. The control module includes a varactor control table 506 and/or a switch control table 508, stored in memory 504. A processor 502 determines a desired beam direction and uses the tables 506 and 508 to determine optimal settings for the phase shifters 308.

Figure 6:
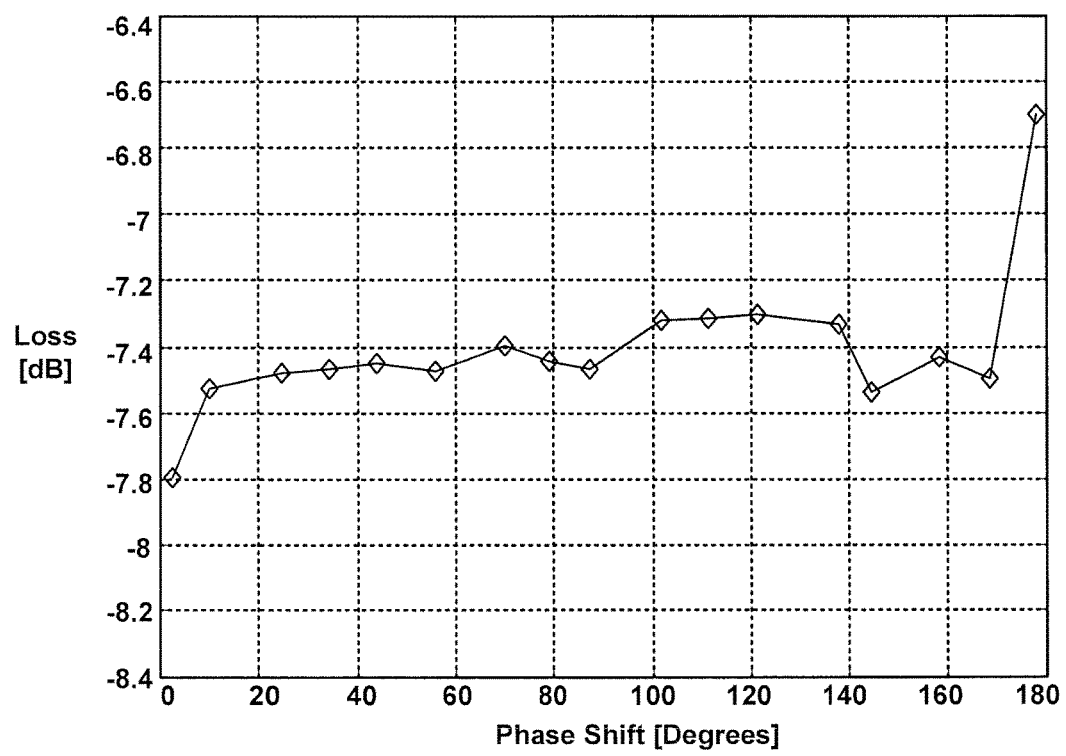
FIG. 6 is a graph illustrating phase shifting with a constant gain in accordance with one illustrative embodiment.

Referring now to FIG. 6, an exemplary simulation of the present principles is shown. A phase shifter according to an embodiment has roughly constant gain across nearly the entire range of its operation. The horizontal axis of the graph shows phase shift, measured in degreed, while the vertical axis measures amplitude loss, measured in decibels.

Figure 7:
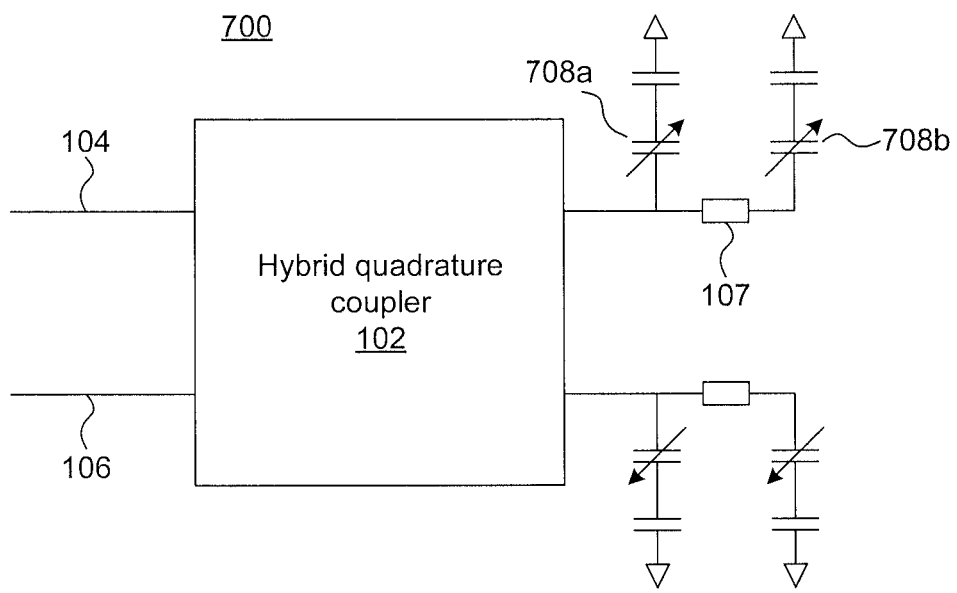
FIG. 7 is a diagram of a phase shifter having two-varactor termination loads in accordance with one illustrative embodiment.

Referring now to FIG. 7, an embodiment of the present principles is provided having two sets of varactors 108 (shown as 708 and 708b). To attain a given phase shift range, typically from 0 to 180 degrees, the capacitance from both varactors is charged from an initial state $C_{min}$ to a final state $C_{max}$. To attain a substantially constant loss over the phase shift range, varactor 708a may change in fine steps, while varactor 708b may change in coarse steps. The phase shift range covered by phase shifter 700 can be divided into two major segments, where each segment corresponds to a coarse setting of varactor 708b. Within each segment, a desired specific phase is attained by setting 708a to a proper value. As long as the correct coarse setting is employed, the loss variation caused by changing the phase within the segment would be minimal.

For example, consider an embodiment where the steps to vary 708a are 0 to 63, and the steps to vary 708b are 0 to 4. For an initial phase change of P1, 708a changes from 0 to 16 while 708b stays constant at 0. Another change to a phase shift of P2 might keep the coarse setting 708b constant at 1 while varying the fine setting of 708a from 14 to 30. In this way, the entire phase range is covered by allowing fine variations on top of the coarse setting, and changes in loss are kept low.

Having described preferred embodiments of a system and method for reflection-type phase shifting with variable loads (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase-shifter, comprising:
    a hybrid quadrature coupler having an input, an output, and two termination loads, where each termination load comprises:
    a plurality of terminations, each comprising a varactor;
    one or more transmission lines separating the terminations; and
    a control module configured to determine a phase shift and gain to apply to the input and to independently control a capacitance of each varactor such that the output of the hybrid quadrature coupler is shifted by the determined phase shift relative to the input with the determined gain.

2. The phase shifter of claim 1, wherein the gain is determined based on a constant output loss across phase shift variations.

3. The phase shifter of claim 1, wherein each termination comprises a bypass capacitor arranged in series with the varactor.

4. The phase shifter of claim 1, further comprising a lookup table that stores predetermined capacitance values for the varactors associated with phase shifts and gains.

5. The phase shifter of claim 4, wherein the control module is further configured to read varactor values from the lookup table in accordance with the determined phase shift and gain to independently control the capacitance of each varactor.

6. A phase-shifter, comprising:
    a hybrid quadrature coupler having an input, an output, and two termination loads, wherein each termination load comprises:
    a plurality of terminations comprising a capacitor and a switch;
    one or more transmission lines separating the terminations; and
    a control module configured to determine a phase shift and gain to apply to the input and to independently control each switch such that the output of the hybrid quadrature coupler is shifted by the determined phase shift relative to the input with the determined gain.

7. The phase shifter of claim 6, wherein the gain is determined based on a constant output loss across phase shift variations.

8. The phase shifter of claim 6, wherein each termination comprises a varactor having a capacitance that is independently controlled by the control module to produce the determined phase shift.

9. The phase shifter of claim 8, further comprising a lookup table that stores predetermined capacitance values for the varactors associated with phase shifts and gains.

10. The phase shifter of claim 9, wherein the control module is further configured to read varactor values from the lookup table in accordance with the determined phase shift and gain to independently control the capacitance of each varactor.

11. The phase shifter of claim 6, further comprising a lookup table that stores predetermined settings for the switches to produce the determined phase shift.

12. A communication device, comprising:
a plurality of antennas, each antenna having an associated phase shifter comprising a hybrid quadrature coupler having an input, an output, and two termination loads, wherein each termination load comprises:
a plurality of terminations comprising a varactor and a switch;
one or more transmission lines separating the terminations; and
a control module configured to determine a phase shift and gain to apply to the input and to independently control each switch and a capacitance of each varactor such that the output of the hybrid quadrature coupler is shifted by the determined phase shift relative to the input with the determined gain to produce a beam steering effect.

13. The communication device of claim 12, wherein the gain is determined based on a constant output loss across phase shift variations.

14. The communication device of claim 12, wherein each termination comprises a bypass capacitor arranged in series with the varactor.

15. The communication device of claim 12, wherein the control module further comprises a lookup table that stores predetermined capacitance values for the varactors associated with phase shifts and gains.

16. The communication device of claim 15, wherein the control module is further configured to read varactor values from the lookup table in accordance with the determined phase shift and gain to independently control the capacitance of each varactor.

17. The communication device of claim 12, wherein the communication device is a transmitter.

18. The communication device of claim 12, wherein the communication device is a receiver.

19. A method for phase shifting a signal, comprising:
determining a phase shift and gain to apply to an input signal; and
adjusting a capacitance for a plurality of varactors in each termination load in a hybrid quadrature coupler to produce a phase shifted output signal having the determined gain, said adjusting comprising:
reading voltage values from a lookup table corresponding to the determined phase shift and gain to determine a voltage to apply to each of the plurality of varactors; and
applying the voltage to each of the plurality of varactors to adjust the capacitance.

20. The method of claim 19, further comprising phase receiving a plurality of signals, each corresponding to one of a plurality of antennas, such that each of the plurality of signals is phase shifted in accordance with a beam steering direction.

21. The method of claim 19, wherein the determined phase shift corresponds to a beam steering direction.

* * * * *